United States Patent
Weitzel et al.

[11] Patent Number: 5,877,047
[45] Date of Patent: Mar. 2, 1999

[54] LATERAL GATE, VERTICAL DRIFT REGION TRANSISTOR

[75] Inventors: Charles E. Weitzel, Mesa; Christine Thero, Scottsdale, both of Ariz.

[73] Assignee: Motorola, Inc., Schaumburg, Ill.

[21] Appl. No.: 912,221

[22] Filed: Aug. 15, 1997

[51] Int. Cl.[6] .................................. H01L 21/338
[52] U.S. Cl. ........................... 438/173; 438/931
[58] Field of Search ................... 438/173, 931, 438/140

[56] References Cited

U.S. PATENT DOCUMENTS

| | | | |
|---|---|---|---|
| 4,888,627 | 12/1989 | Pattanyak et al. | 357/23.4 |
| 4,901,127 | 2/1990 | Chow et al. | 357/23.4 |
| 5,032,880 | 7/1991 | Tsunoda | 357/23.4 |
| 5,396,087 | 3/1995 | Baliga | 257/139 |
| 5,543,637 | 8/1996 | Baliga | 257/77 |
| 5,681,762 | 10/1997 | Baliga | 437/22 |
| 5,780,878 | 7/1998 | Bhatnagar et al. | 257/139 |

*Primary Examiner*—John F. Niebling
*Assistant Examiner*—Michael S. Lebentritt
*Attorney, Agent, or Firm*—Eugene A. Parsons; William E. Koch

[57] ABSTRACT

This is a method of fabricating a lateral gate, vertical drift region transistor including a semiconductor substrate having a drain on the reverse surface. A doped semiconductor layer is formed on the substrate and a high resistivity region is formed adjacent the surface of the doped layer so as to define a vertical drift region in the doped layer. A lateral channel is formed on the high resistivity region and the doped layer so as to communicate with the vertical drift region. A source is positioned on the lateral channel spaced laterally from the vertical drift region and a gate is positioned on the lateral channel between the drift region and the source.

11 Claims, 4 Drawing Sheets

LATERAL GATE, VERTICAL DRIFT REGION TRANSISTOR

FIELD OF THE INVENTION

The present invention pertains to transistors and the fabrication thereof, and more specifically to lateral gate, vertical drift transistors.

BACKGROUND OF THE INVENTION

One of the leading semiconductor products at the present time is a combination lateral and vertical field-effect-transistors (FET), which can be used in devices such as MESFETs, HFETs, etc.. These devices are especially useful in high voltage applications because they incorporate a vertical drift region formed in a relatively thick and low doped layer of material, generally including the substrate. However, to increase their utility or versatility, the FET should have low interelectrode capacitance, low ON-resistance, good switching characteristics (e.g. switching times, etc.), low leakage currents, high channel density, etc.

A MESFET with a buried shielding region is disclosed in a U.S. Pat. No. 5.077,589, entitled "MESFET Structure Having A Shielding Region", issued Dec. 31, 1991. The shielding region in the disclosed structure is a p-type doped region in an n-type transistor. Thus, p-type layers and p-type ohmic contacts are required during fabrication. Another device with a doped buried semiconductor region is disclosed in a copending application entitled "Lateral Gate, Vertical Drift Region Transistor", Ser. No. 08/681,684, filed 29 Jul. 1996 and assigned to the same assignee. In this device the buried region is also a semiconductor material doped opposite to the transistor. Because of the conductive buried layers in these types of devices, they have a relatively high source-drain and source channel capacitance which reduces the speed and degrades the frequency performance.

Accordingly, it would be highly advantageous to have a manufacturable FET with low internal capacitance, low ON-resistance, good switching characteristics (e.g. switching times, etc.), low leakage currents, high current density, etc.

It is a purpose of the present invention to provide a new and improved FET with low interelectrode capacitance.

It is another purpose of the present invention to provide a new and improved FET with low interelectrode capacitance which is relatively simple and inexpensive to manufacture because of reduced fabrication steps.

It is a further purpose of the present invention to provide a new and improved FET which can be fabricated in a variety of material systems and structures, including GaAs, GaN, and SiC, and MESFETs, HFETs, etc.

SUMMARY OF THE INVENTION

The above problems and others are at least partially solved and the above purposes and others are realized in a method of fabricating a lateral gate, vertical drift region transistor including a first current terminal positioned on the opposite surface of a semiconductor substrate, a doped semiconductor layer formed on the substrate, and a high resistivity region formed adjacent the surface of the doped semiconductor layer so as to define a drift region in the doped semiconductor layer extending from and generally perpendicular to the first surface of the substrate. A lateral channel is formed on the high resistivity region and the doped semiconductor layer so as to communicate with the vertical drift region and a second current terminal is formed on the lateral channel and spaced laterally from the vertical drift region. A control terminal is positioned on the lateral channel between the drift region and the second current terminal.

The high resistivity region can be formed in several different embodiments, including one embodiment in which particles are implanted in an epitaxial layer, before or after the channel layer is formed, and a second embodiment in which a first epitaxial layer is formed on the substrate, a second, resistive epitaxial layer is formed on the first epitaxial layer and the high resistivity region is formed from the second layer, and a third epitaxial layer defining the lateral channel is formed on the second epitaxial layer.

BRIEF DESCRIPTION OF THE DRAWINGS

Referring to the drawings.

DESCRIPTION OF THE PREFERRED EMBODIMENTS

Figure 1:
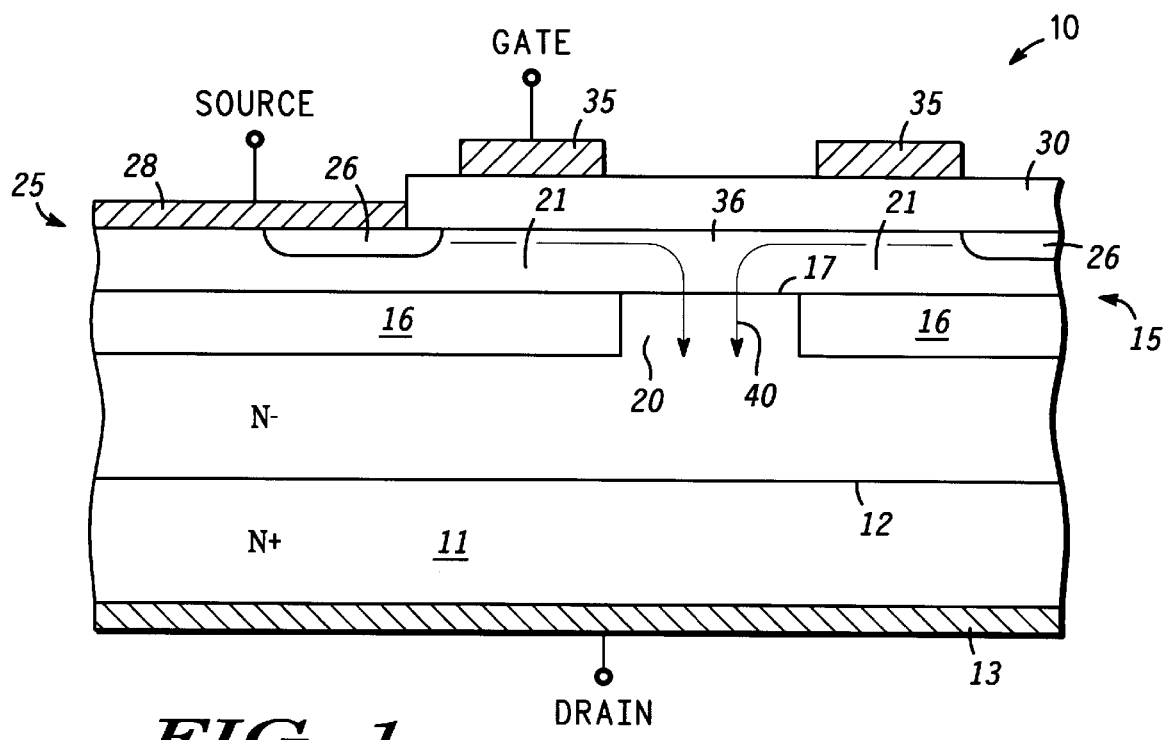
FIG. 1 is a simplified sectional view of a transistor in accordance with the present invention.

Referring specifically to FIG. 1, a simplified sectional view is illustrated of a lateral gate, vertical drift region transistor 10 in accordance with the present invention. Transistor 10 includes a semiconductor substrate 11 with an upper surface 12, which may be any convenient semiconductor material, such as silicon, silicon carbide, gallium arsenide, gallium nitride, etc., doped for a first type of conductivity. In this preferred embodiment, substrate 11 is formed of gallium arsenide and is heavily doped ($N^+$) for n-conductivity. A layer 13 of metal is deposited on a lower or rear surface of substrate 11 and processed to form an ohmic contact by techniques well known by those skilled in the art. In this embodiment, layer 13 is a drain terminal for transistor 10. It will be understood that layer 13 can be deposited at any convenient time throughout the fabrication process and the description is included at this time for simplicity of understanding.

A doped semiconductor layer 15 is positioned on surface 12 of substrate 11 and defines a surface 17 parallel with and spaced from surface 12 of the substrate. A high resistivity region (or regions) 16 is positioned in/on doped layer 15 so as to define a drift region 20 in doped layer 15 extending from and generally perpendicular to surface 12 of substrate 11. The thickness and the doping of drift region 20 are designed to support a given breakdown voltage using basic device physics. Further, a layer of doped semiconductor material is positioned on high resistivity region 16 and doped layer 15 so as to define a lateral channel 21 in communication with drift region 20. While high resistivity region 16 appears in FIG. 1 as two spaced apart portions, it will be understood by those skilled in the art that transistor 10 is normally constructed with a closed formation, i.e. high resistivity region 16 may appear circular, race-track shaped, serpentine, stripes, etc. in a top plan, all such formations being well known in the art.

A second current terminal 25 is positioned on doped structure 15 in communication with lateral channel 21 and spaced laterally from drift region 20. Second current terminal 25, which in this embodiment is a source terminal of transistor 10, includes an implant area 26 which is heavily doped (N+) with the first conductivity type. A metal layer 28 is deposited on surface 17 in electrical contact with implant area 26 and is processed in a well known manner to provide an ohmic contact between metal layer 28 and implant area 26.

If transistor 10 is to be a MOSFET, an insulating layer 30 is positioned on the surface of lateral channel 21 between implant area 26 and drift region 20. In a preferred embodiment insulating layer 30 is an oxide or nitride grown on surface 17. A metal layer 35 is deposited on layer 30 and processed in a well known manner to produce a contact which operates as a gate terminal. If transistor 10 is to be a MESFET, a Schottky gate is formed in a well known manner by eliminating insulating layer 30 and placing metal layer 35 directly on lateral channel 21. When properly energized by potentials applied between the source, drain and gate terminals in a well known fashion, transistor 10 conducts current from source contact 28, implant 26, lateral channel 21, drift region 20, and substrate 11 to drain terminal 13, as represented by arrows 40. If transistor 10 is to be an HFET (heterojunction FET), an insulating material such as AlGaAs or AlGaN is used as insulating layer 30.

Transistor 10 has high current density, independent control over threshold voltage and breakdown voltage, reduced fabrication steps (as will be explained more completely) with no p-type ohmic contacts needed, and low device capacitances because of the use of high resistivity region 16 to better define lateral channel 21 and drift region 20. As pointed out above, the doping level of drift region 20 determines the desired breakdown voltage of transistor 10 and, because of the better definition, drift region 20 can be doped lighter to increase the breakdown voltage. High resistivity region 16 provides a backside to lateral channel 21 and defines an opening for drift region 20 so that current can flow from source 26 to drain 13 with proper energization of source terminal 25, drain terminal 13 and gate terminal 35.

Figure 2:
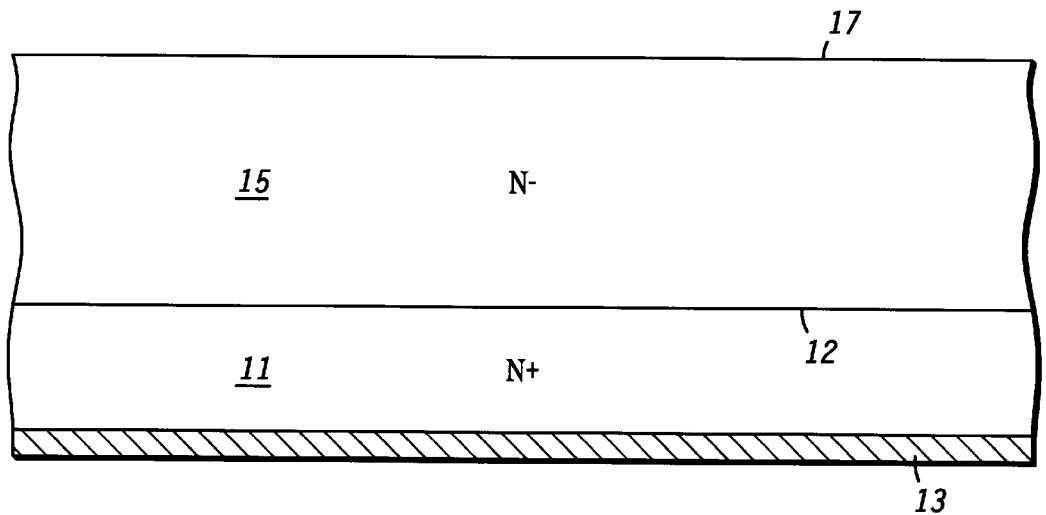
FIGS. 2–4 illustrate several steps in a method of fabricating the transistor of FIG. 1.
Figure 3:
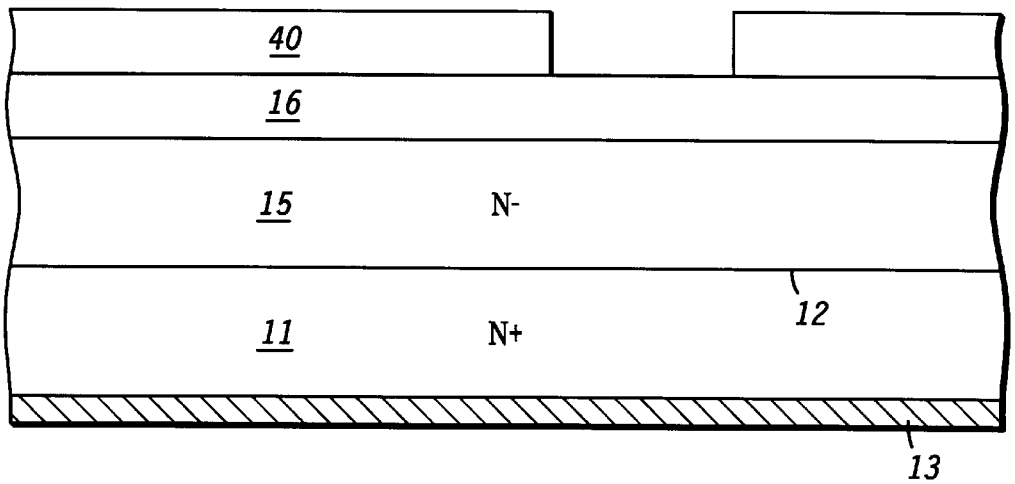
Figure 4:
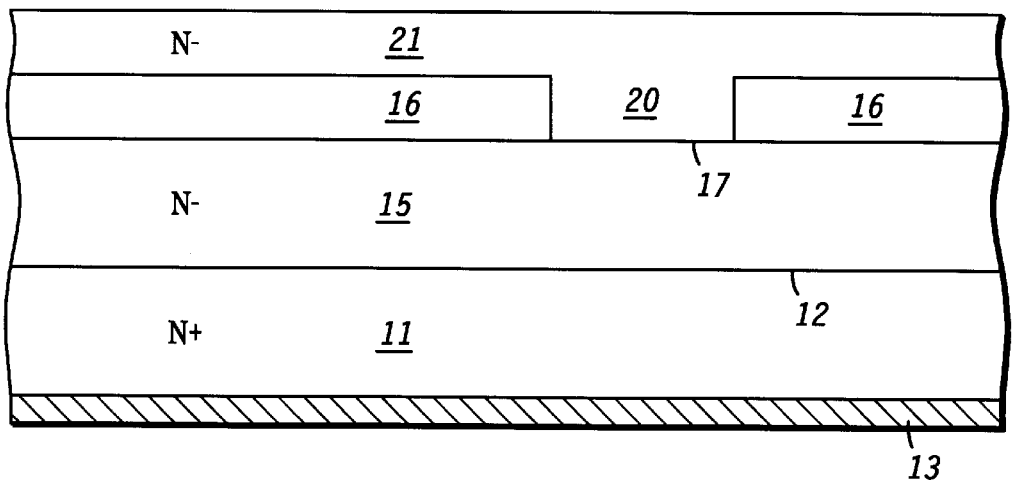

Turning now to FIGS. 2–4, several steps in one process for fabricating high resistivity region 16 in transistor 10 are illustrated. Components which are similar to components of transistor 10 in FIG. 1 are designated with the same numbers to aid in comparing the devices. Referring specifically to FIG. 2, a semiconductor substrate 11, in this example a gallium arsenide substrate, having an upper surface 12 is provided and a current contact 13 is formed on the lower surface. Substrate 11 is heavily doped for N-conductivity. An epitaxial layer 15 lightly doped for N-conductivity is epitaxially grown on surface 12 utilizing any of the well known processes. Epitaxial layer 15 represents doped semiconductor layer 15 described in conjunction with FIG. 1 and defines an upper surface 17.

Turning to FIG. 3, a layer 16 of high resistivity material, such as low temperature GaAs is grown on first epitaxial layer 15 utilizing any of the well known processes. An etch mask 40 is formed on the upper surface of high resistivity layer 16 in any well known technique, such as photoresist, dielectric, or metal and patterning. Etch mask 40 is then used to etch an opening through high resistivity layer 16, which opening will ultimately define drift region 20. A third epitaxial layer is then epitaxially grown over high resistivity layer 16, including the opening therethrough to form lateral channel 21. Because high resistivity layer 16 is relatively thin (0.4 μm to 0.9 μm), the nonuniformity which would be produced by the opening (drift region 20) in high resistivity layer 16 can be compensated for relatively simply, if necessary, with an additional mask and growth stage in the opening after which the mask is removed and the complete layer (channel 21) is grown, as illustrated in FIG. 4.

In a somewhat similar technique, layer 16 can be formed of a material containing aluminum, such as AlGaAs. Layer 16 is etched to define drift region 20, as described above, and epitaxial layer 21 is grown as illustrated in FIG. 4. The structure is then put in an heated oxidizing ambient and the aluminum is converted to an aluminum oxide with high resistivity. As a specific example, layer 15 is $Al_{0.98}Ga_{0.02}As$ which is heated to about 400° C. in oxygen (steam) so as to convert it to $Al_2O_3$.

Figure 5:
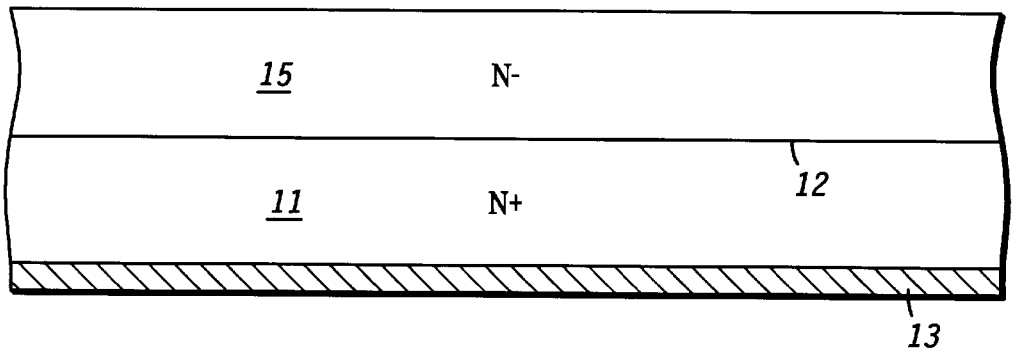
FIGS. 5–7 illustrate several steps in another method of fabricating the transistor of FIG. 1.
Figure 6:
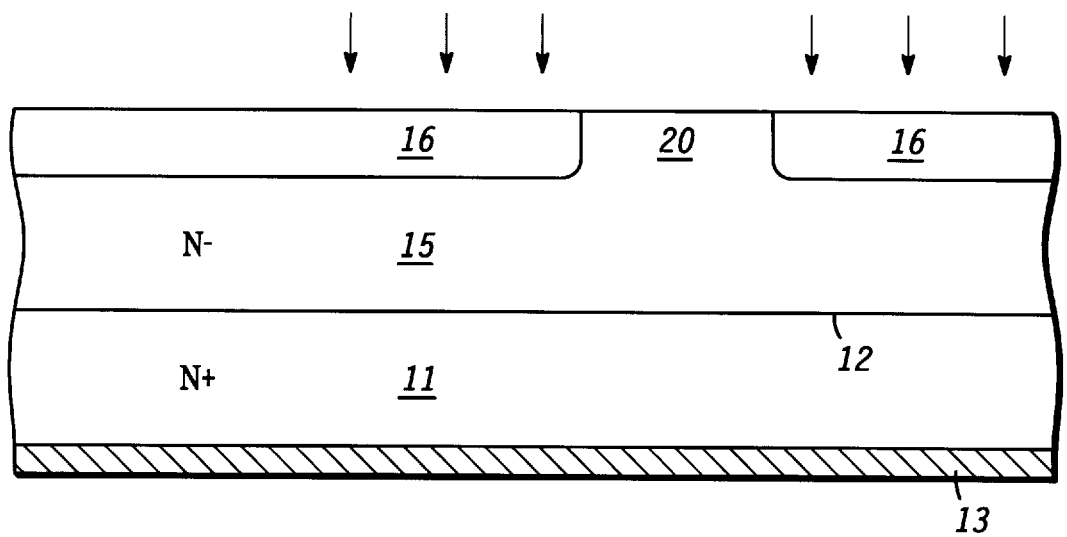
Figure 7:
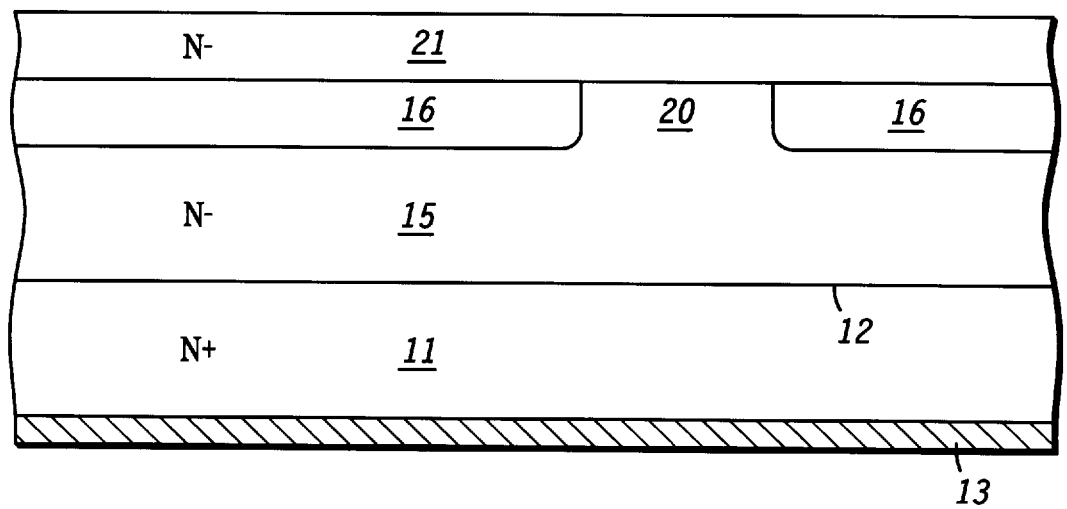

Turning now to FIGS. 5–7, several steps in another process for fabricating high resistivity region 16 in transistor 10 is illustrated. Components which are similar to components of transistor 10 in FIG. 1 are designated with the same numbers to aid in comparing the devices. Referring specifically to FIG. 5, a semiconductor substrate 11 having an upper surface 12 is provided and a current contact 13 is formed on the lower surface. Substrate 11 is heavily doped for N-conductivity. A first epitaxial layer 15 lightly doped for N-conductivity is epitaxially grown on surface 12 utilizing any of the well known processes. Epitaxial layer 15 represents doped semiconductor layer 15 described in conjunction with FIG. 1.

After growing epitaxial layer 15, high resistivity region 16 is formed by ion-implantation into epitaxial layer 15, patterning the ion implant to define drift region 20 therethrough, as illustrated in FIG. 6. The ion-implantation can be performed using any of the standard techniques known in the art, generally including an implant mask (not shown) and implanting a material, such as ions of oxygen or hydrogen. Channel layer 21 is then grown on top of implanted high resistivity region 16 and drift region 20, as illustrated in FIG. 7.

Figure 8:
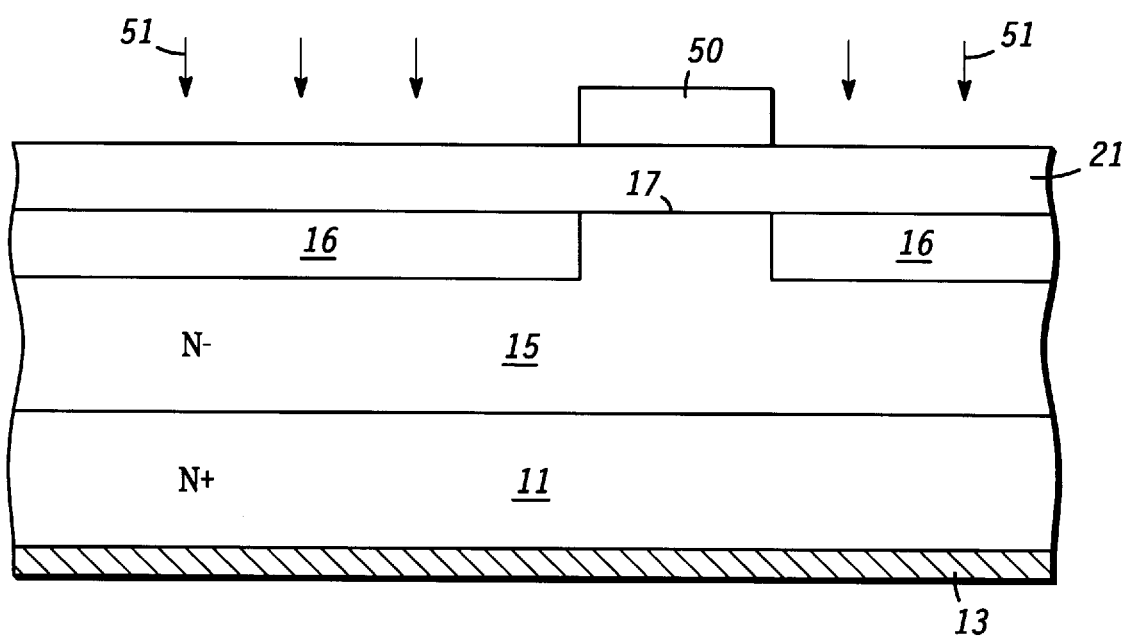
FIG. 8 illustrates steps in another method of fabricating the transistor of FIG. 1.

Turning now to FIG. 8, several steps in yet another process for fabricating high resistivity region 16 in transistor 10 is illustrated. Components which are similar to components of transistor 10 in FIG. 1 are designated with the same numbers to aid in comparing the devices and methods. In this embodiment it is again assumed that the structure of FIG. 5 is the starting point.

Turning to FIG. 8, an epitaxial layer (channel 21) is grown on surface 17 of epitaxial layer 15 in any well known manner. An implant mask 50 is then formed on the surface of the epitaxial layer (channel 21) and high resistivity region 16 is implanted in doped semiconductor layer 15. For example, a combination of metal or dielectric layers and photoresist are deposited on channel 21 and patterned by exposing the photoresist and then using it to etch the metal. The patterned metal and remaining photoresist, if convenient, is then used as a mask to deeply implant particles into epitaxial layer 15, whereby high resistivity region 16 is formed. Any material which will provide the desired implant damage and is capable of being deeply implanted can be used, such as ions of hydrogen.

In a specific example, the upper surface of high resistivity region 16 is in the range of approximately 0.2 μm to 0.3 μm below surface 17 and the lower surface is in the range of approximately 0.7 μm to 1.1 μm below surface 17. Also, the lower surface of high resistivity region 16 is in the range of 5 μm to 35 μm from surface 12 of substrate 11. In this example the particles forming high resistivity region 16 are implanted (represented by arrows 51) with a dose of 5E15 to 5E16 at an energy in the range of 200 KeV to 1 MeV to achieve the desired depth. With high resistivity region 16 properly formed, implant mask 50 is removed.

Accordingly, a new and improved MOSFET is disclosed including a vertical drift region, MOS gate control, a lateral gate or channel region, and an accumulation layer. Further, the improved MOSFET can easily be fabricated in a SiC material system, in a silicon system, in a gallium arsenide system, etc. Generally, a SiC material system is preferred because of the lower ON-resistance, especially for high power applications. The vertical drift region provides higher channel density and a substantial savings in semiconductor substrate real estate. The MOS gate control provides higher transconductance and reduced gate leakage current. The lateral gate or channel region provides improved oxide and an improved epitaxial layer to oxide (SiC/SiO2) interface. The accumulation region provides a 5 to 10 improvement factor in particle mobility over prior art inversion layer devices and a lower ON-resistance. Thus, a new and improved MOSFET with low ON-resistance, good switching characteristics, low leakage current, and high channel density is disclosed.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. A method of fabricating a lateral gate, vertical drift region transistor comprising the steps of:
   providing a semiconductor substrate having a first surface and an opposite surface and positioning a first current terminal on the opposite surface;
   forming a doped semiconductor layer on the first surface of the substrate, with a surface parallel to and spaced from the first surface of the substrate;
   forming a high resistivity region adjacent the surface of the doped semiconductor layer so as to define a drift region in the doped semiconductor layer extending from and generally perpendicular to the first surface of the substrate and forming the high resistivity region of material having a high resistivity relative to the doped semiconductor layer;
   forming a lateral channel on the high resistivity region and the doped semiconductor layer so as to communicate with the vertical drift region and forming the lateral channel of material having a low resistivity relative to the high resistivity region;
   positioning a second current terminal on the doped structure in communication with the lateral channel and spaced laterally from the vertical drift region; and
   positioning a control terminal on the lateral channel between the drift region and the second current terminal.

2. A method of fabricating a lateral gate, vertical drift region transistor as claimed in claim 1 wherein the steps of providing the substrate and forming the doped semiconductor layer include providing a substrate with a first conductivity and epitaxially growing the doped semiconductor layer on the first surface of the substrate.

3. A method of fabricating a lateral gate, vertical drift region transistor as claimed in claim 1 wherein the step of forming the high resistivity region includes the steps of growing a layer of low temperature gallium arsenide on the surface of the doped semiconductor layer, patterning the layer of low temperature gallium arsenide to form an opening therethrough exposing a portion of the surface of the doped semiconductor layer, and growing the lateral channel on the layer of low temperature gallium arsenide and the exposed portion of the surface of the doped semiconductor layer.

4. A method of fabricating a lateral gate, vertical drift region transistor as claimed in claim 1 wherein the step of forming the high resistivity region includes the steps of growing a layer of aluminum containing material on the surface of the doped semiconductor layer, patterning the layer of aluminum containing material to form an opening therethrough exposing a portion of the surface of the doped semiconductor layer, growing the lateral channel on the layer of aluminum containing material and the exposed portion of the surface of the doped semiconductor layer, and oxidizing the layer of aluminum containing material to form a high resistivity aluminum oxide.

5. A method of fabricating a lateral gate, vertical drift region transistor as claimed in claim 4 wherein the step of oxidizing the layer of aluminum containing material includes heating the layer of aluminum containing material to a temperature of approximately 400° C. in the presence of oxygen.

6. A method of fabricating a lateral gate, vertical drift region transistor as claimed in claim 1 wherein the step of forming the high resistivity region includes the steps of implant damaging a region adjacent the surface of the doped semiconductor layer to form the high resistivity region, and growing the lateral channel on the surface of the doped semiconductor layer.

7. A method of fabricating a lateral gate, vertical drift region transistor as claimed in claim 6 wherein the step of implant damaging includes implanting one of oxygen and hydrogen ions.

8. A method of fabricating a lateral gate, vertical drift region transistor as claimed in claim 1 wherein the step of forming the high resistivity region includes the steps of growing the lateral channel on the surface of the doped semiconductor layer, and implant damaging a region adjacent the surface of the doped semiconductor layer through the lateral channel to form the high resistivity region.

9. A method of fabricating a lateral gate, vertical drift region transistor as claimed in claim 8 wherein the step of implant damaging includes implanting one of oxygen and hydrogen ions.

10. A method of fabricating a lateral gate, vertical drift region transistor as claimed in claim 1 wherein the step of forming the lateral channels includes growing an epitaxial layer on the high resistivity region and the doped semiconductor layer.

11. A method of fabricating a lateral gate, vertical drift region transistor comprising the steps of:
   providing a semiconductor substrate having a first surface and an opposite surface and positioning a first current terminal on the opposite surface;
   epitaxially growing a doped semiconductor layer on the first surface of the substrate, with a surface parallel to and spaced from the first surface of the substrate;
   forming a high resistivity region adjacent the surface of the doped semiconductor layer so as to define a drift region in the doped semiconductor layer extending from and generally perpendicular to the first surface of the substrate and forming the high resistivity region of material having a high resistivity relative to the doped semiconductor layer;

epitaxially growing a lateral channel on the high resistivity region and the doped semiconductor layer so as to communicate with the vertical drift region and forming the lateral channel of material having a low resistivity relative to the high resistivity region;

positioning a second current terminal on the doped structure in communication with the lateral channel and spaced laterally from the vertical drift region; and positioning a control terminal on the lateral channel between the drift region and the second current terminal.

* * * * *